(12) United States Patent
Stroud et al.

(10) Patent No.: US 6,807,280 B1
(45) Date of Patent: Oct. 19, 2004

(54) AUDIO SIGNAL PROCESSING CIRCUIT FOR REDUCING NOISE IN AN AUDIO SIGNAL

(75) Inventors: Richard Sidney Stroud, Kokomo, IN (US); Gary Michael McQuilling, Russiaville, IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 09/013,176

(22) Filed: Jan. 26, 1998

(51) Int. Cl.[7] .............................. H03G 7/00; H03G 3/00
(52) U.S. Cl. ......................... 381/106; 381/104; 333/14
(58) Field of Search ................................ 381/104, 107, 381/106; 455/569; 333/14

(56) References Cited

U.S. PATENT DOCUMENTS

| | | | |
|---|---|---|---|
| 2,504,971 A | 4/1950 | Fisher | 179/1 |
| 3,691,311 A | 9/1972 | Wilson | 179/81 B |
| 3,769,611 A * | 10/1973 | Scaggs | 330/126 |
| 4,081,620 A | 3/1978 | Goodman et al. | 179/81 A |
| 4,184,047 A * | 1/1980 | Langford | 381/63 |
| 4,297,527 A | 10/1981 | Pate | 179/1 VC |
| 4,461,025 A | 7/1984 | Franklin | 381/56 |
| 4,609,878 A * | 9/1986 | Rodgers | 330/136 |
| 4,837,832 A | 6/1989 | Fanshel | 381/68.4 |
| 4,866,779 A | 9/1989 | Kennedy et al. | |
| 4,891,837 A | 1/1990 | Walker et al. | 379/390 |
| 5,027,410 A * | 6/1991 | Williamson et al. | 381/320 |
| 5,048,091 A | 9/1991 | Sato et al. | 381/107 |
| 5,132,632 A | 7/1992 | Russell et al. | 328/16 |
| 5,151,939 A | 9/1992 | Marrah et al. | |
| 5,261,004 A | 11/1993 | Manlove et al. | |
| 5,333,201 A * | 7/1994 | Waller, Jr. | 381/22 |
| 5,396,562 A | 3/1995 | Ishimitsu et al. | 381/107 |
| 5,404,315 A | 4/1995 | Nakano et al. | 364/514 |
| 5,485,515 A | 1/1996 | Allen et al. | 379/391 |
| 5,488,668 A | 1/1996 | Waldhauer | 381/68.4 |
| 5,526,419 A | 6/1996 | Allen et al. | 379/387 |
| 5,557,237 A | 9/1996 | Carpentier | 330/129 |
| 5,794,187 A * | 8/1998 | Franklin et al. | 704/225 |
| 6,501,944 B1 | 12/2002 | Szydlowski et al. | |

OTHER PUBLICATIONS

Howard Tremaine, Audiocyclopedia, 1959, Howard W. Sams & Co., Inc., p. 932.*

* cited by examiner

Primary Examiner—Forester W. Isen
Assistant Examiner—Elizabeth McChesney
(74) Attorney, Agent, or Firm—Stefan V. Chmielewski

(57) ABSTRACT

An audio signal processing circuit reduces noise in an incoming audio signal and is particularly useful in telephone communication systems utilizing one or more hands-free microphones. A preferred embodiment of the audio signal processing circuit includes a pre-emphasis circuit receiving the audio signal from a microphone or other transducer, an amplifier circuit receiving the pre-emphasized audio signal from the pre-emphasis circuit and a de-emphasis circuit receiving the amplified signal from the amplifier circuit. An output of the de-emphasis circuit provides the processed audio signal having an improved signal to noise ratio with minimum audible distortion. A preferred embodiment of the amplification circuit includes an amplifier defining a non-linear transfer function therethrough which provides low gain to the lower amplitude noise signals and higher gain to the higher amplitude audio signals.

5 Claims, 3 Drawing Sheets

AUDIO SIGNAL PROCESSING CIRCUIT FOR REDUCING NOISE IN AN AUDIO SIGNAL

FIELD OF THE INVENTION

The present invention relates generally to audio signal processing circuits, and more specifically to audio signal processing circuits for reducing noise in audio signals.

BACKGROUND OF THE INVENTION

Telephone communications are made easier and sometimes safer through the use of so-called "hands-free" microphones. Such microphones are typically located remote from the talker or talkers and thus pick up many times more noise and echo than with typical a hand-held unit. This problem is typically compounded in cellular telephone communications systems located in a moving vehicle due to added sources of noise such as road noise, for example.

Noise reduction units are known and are operable to enhance the sound quality and intelligibility of voice recognition systems by providing up to 15–20 dB of effective noise reduction. However, known noise reduction systems have drawbacks associated therewith. For example, some such noise reduction systems using digital signal processing technology create an artificial quality to the reproduced voice and are costly to implement. Known dynamic noise reduction (DNR) circuits, on the other hand, do not appear to work as well in very noisy environments, as "fuzzballs" of modulated noise tend to appear in the received signal.

What is therefore needed is an improved noise reduction system operable to enhance sound quality and intelligibility in telephone communication systems employing hands-free microphones, wherein such a noise reduction system is inexpensive and easy to implement, and provides a significant improvement in the signal to noise ratio while minimizing audible distortion.

SUMMARY OF THE INVENTION

The present invention addresses the foregoing drawbacks of prior art distortion limiting amplifiers. In accordance with one aspect of the present invention, a signal processing circuit for reducing noise in an audio signal comprises a pre-emphasis circuit having an input receiving an audio signal and an output providing a pre-emphasized representation of the audio signal, the audio signal including a higher amplitude audio component and a lower amplitude noise component, an amplifier including a first input coupled to the pre-emphasis circuit output and an output, the amplifier defining a smooth transfer function providing higher gain to the higher amplitude audio component and lower gain to the noise component of the audio signal, and a de-emphasis circuit having an input connected to the amplifier output and an output providing a de-emphasized representation of the audio signal processed by the amplifier in accordance with the transfer function.

In accordance with another aspect of the present invention, an amplifier circuit for reducing noise in an audio signal comprises a non-inverting input receiving an audio signal, the audio signal including a higher amplitude audio component and a lower amplitude noise component, an inverting input, an output, and feedback circuitry connected between the output and the inverting input. The feedback circuit defines an amplifier transfer function having a smooth non-linear characteristic providing higher gain to the higher amplitude audio component and lower gain to the lower amplitude noise component.

In accordance with a further aspect of the present invention, an amplifier circuit for reducing noise in an audio signal comprises a non-inverting input connected to ground potential, an inverting input, an output, and feedback circuitry connected between the output and the inverting input, wherein the feedback circuitry receives an audio signal including a higher amplitude audio component and a lower amplitude noise component. The feedback circuitry defines an amplifier transfer function having a smooth non-linear characteristic providing higher gain to the higher amplitude audio component and lower gain to the lower amplitude noise component.

One object of the present invention is to provide an audio signal processing circuit providing a non-linear gain proportional to signal amplitude.

Another object of the present invention is to provide such a circuit wherein the non-linear gain is smooth and bi-directional to thereby minimize audible distortion of the processed audio signal.

Yet another object of the present invention is to provide such a circuit further having the audio signal pre-processed by a pre-emphasis circuit and post-processed by a de-emphasis circuit to thereby further minimize audible distortion of the processed audio signal.

These and other objects of the present invention will become more apparent from the following description of the preferred embodiment.

DESCRIPTION OF THE PREFERRED EMBODIMENTS

Figure 1:
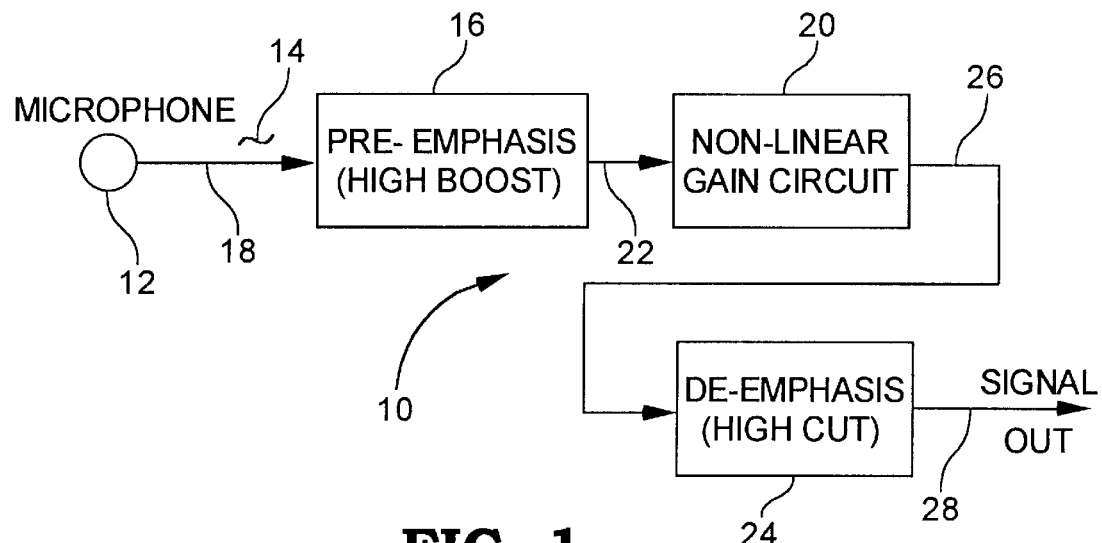
FIG. 1 is a block diagram illustrating one embodiment of the audio signal processing circuit of the present invention.

For the purposes of promoting an understanding of the principles of the invention, reference will now be made to the embodiments illustrated in the drawings and specific language will be used to describe the same. It will nevertheless be understood that no limitation of the scope of the invention is thereby intended, such alterations and further modifications in the illustrated devices, and such further applications of the principles of the invention as illustrated therein being contemplated as would normally occur to one skilled in the art to which the invention relates.

Referring now to FIG. 1, a block diagram illustrating one embodiment of an audio signal processing circuit 10, in accordance with the present invention, is shown. Circuit 10 includes a microphone 12 or other known transducer operable to convert a voice or other audible sound to an audio signal 14. A known pre-emphasis circuit 16 has an input connected to microphone 12 via signal path 18 and an output connected to an input of a non-linear gain circuit 20 via signal path 22. Non-linear gain circuit 20 has an output connected to a known de-emphasis circuit 24 via signal path 26 and de-emphasis circuit 24 has an output providing the processed audio signal on signal path 28, which is labeled SIGNAL OUT in FIG. 1.

Pre-emphasis circuit 16 and de-emphasis circuit 24 may be formed in accordance with known techniques and with known circuit components. It is known in the art that desired audio signals in the higher audio-frequency range typically have relatively low amplitude because they are harmonics of the fundamental tones. Therefore, it is desirable to pre-emphasize the amplitude of higher audio frequencies by increasing their relative values prior to amplification. Circuitry for providing such a pre-emphasis function is known and may be manifested as a high pass filter. The result of pre-emphasis, followed by subsequent de-emphasis, is to provide a processed signal having a higher signal to noise ratio. In order to restore the original relative amplitudes, the audio signal is de-emphasized after amplification by de-emphasis circuit 24. Circuitry for providing such a de-emphasis function is known and may be manifested as a low pass filter.

Figure 2:
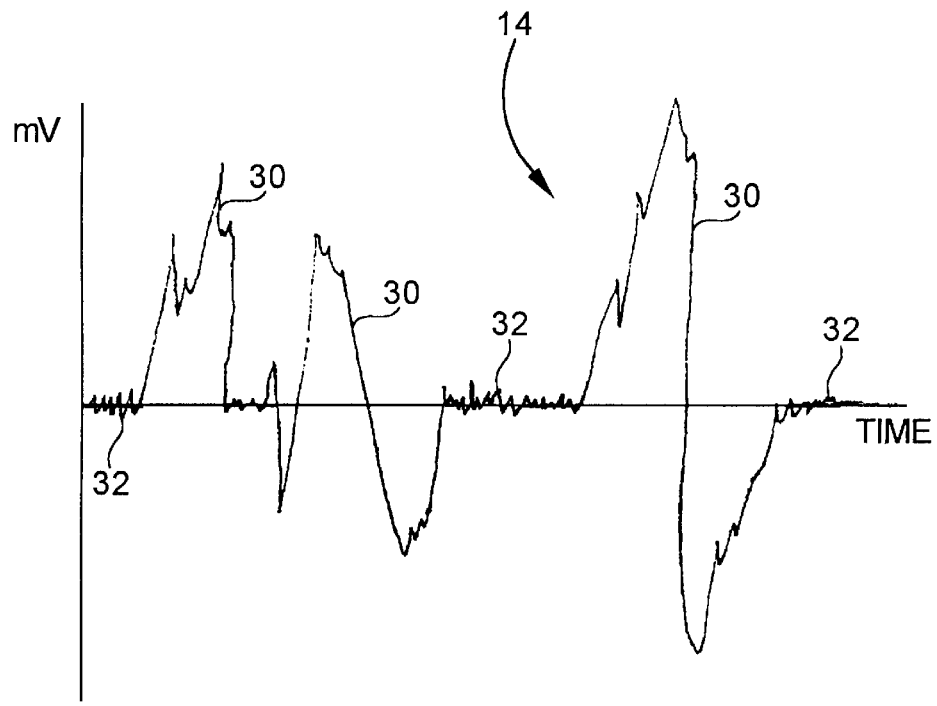
FIG. 2 is a plot illustrating a typical audio signal including noise components prior to processing by the circuit of FIG. 1.

The present invention takes advantage of the fact that noise accompanying voice or other audible sound sensed by a suitable transducer is typically lower in amplitude than the desired audible components of the resultant signal. Referring to FIG. 2, this is illustrated by a representation of the audio signal 14 of FIG. 1, wherein signal 14 includes higher amplitude audio components 30 and lower amplitude noise components 32 during periods when the higher amplitude audio components 30 are not present. In accordance with the present invention, the amplification or gain circuit 20 is provided with a non-linear transfer function that offers low gain to the lower amplitude noise components 32 and higher gain to the higher amplitude audio components 30. By suppressing noise during periods when the higher audio components 30 are not present, the signals processing circuit 10 of the present invention provides a subjective perceptual effect of continuous noise reduction.

Figure 3:
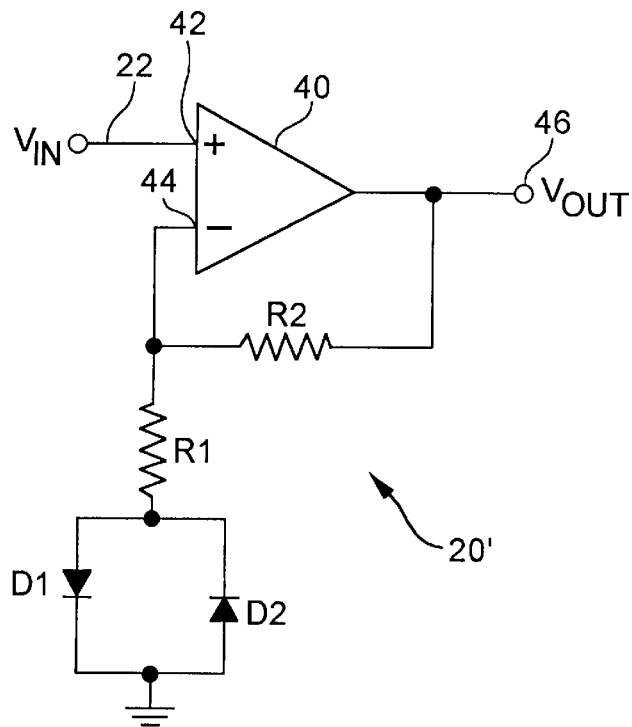
FIG. 3 is a schematic diagram illustrating one embodiment of the non-linear gain circuit shown in FIG. 1, in accordance with the present invention.

Referring now to FIG. 3, one preferred embodiment of a non-linear gain or amplification circuit 20', which corresponds to the circuit block 20 of FIG. 1, is illustrated. Circuit 20' includes an amplifier 40 of known construction, wherein amplifier 40 includes a non-inverting input 42 connected to signal path 22 (FIG. 1) and receiving a signal $V_{IN}$. When amplifier circuit 20' is inserted into the signal processing circuit 10 of FIG. 1, the signal $V_{IN}$ corresponds to the pre-emphasized audio signal provided by pre-emphasis circuit 16. However, those skilled in the art will recognize that $V_{IN}$ may be any communication signal wherein it is desirable to provide lower gain to low amplitude components and higher gain to higher amplitude components of the communication signal. In any case, amplifier 20' also includes an inverting input 44 connected to a first end of a resistor R1 and a first end of a feedback resistor R2. The opposite end of feedback resistor R2 is connected to an output 46 of amplifier 40 and provides a signal $V_{out}$. When amplifier circuit 20' is inserted into the signal processing circuit 10 of FIG. 1, the signal $V_{OUT}$ corresponds to the processed audio signal provided to de-emphasis circuit 24. However, those skilled in the art will recognize that $V_{out}$ may be alternatively provided to other audio signal processing circuits as part of a system wherein it is desirable to provide lower gain to low amplitude components and higher gain to higher amplitude components of a communication signal. The opposite end of resistor R1 is connected to an anode of a first diode D1 and to a cathode of a second diode D2. Diodes D1 and D2 may be of known construction, and the cathode of D1 is connected to the anode of D2 and also to ground potential.

The transfer function of the amplifier circuit 20' illustrated in FIG. 3 is defined as the instantaneous gain of the circuit which is given by the equation:

$$\text{instantaneous gain} = 1 + [R2/(\text{diode resistance} + R1)] \qquad (1),$$

wherein the diode resistance is given by the equation:

$$\text{diode resistance} = [\ln(\text{diode current} * 2.5 \times 10^{14})/(40 \times \text{diode current})] \qquad (2).$$

Figure 4:
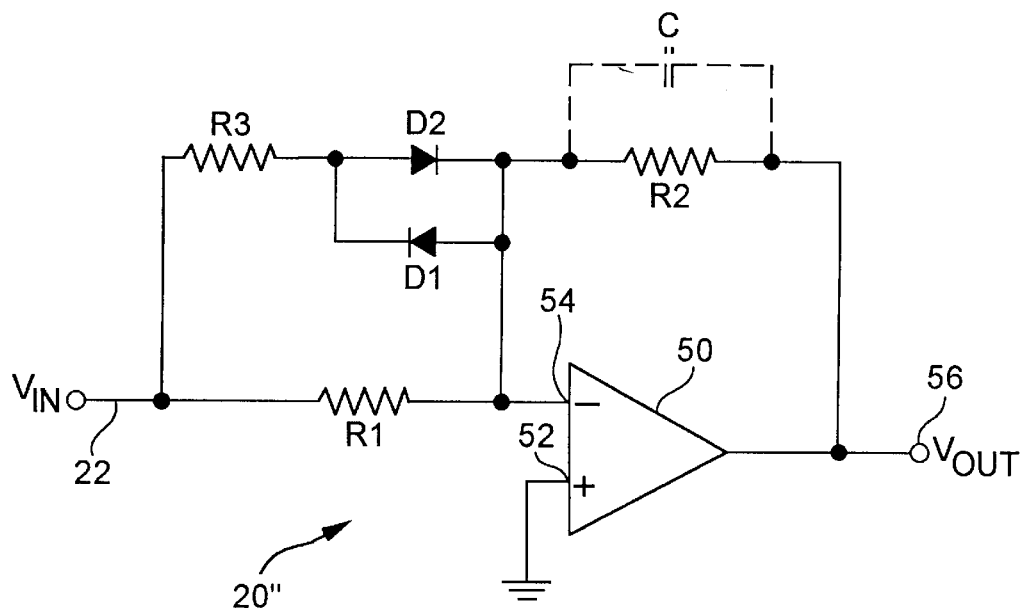
FIG. 4 is a schematic diagram illustrating another embodiment of the non-linear gain circuit shown in FIG. 1, in accordance with the present invention.

Referring now to FIG. 4, an alternate embodiment of a non-linear gain or amplification circuit 20", which corresponds to the circuit block 20 of FIG. 1, is illustrated. Circuit 20" includes an amplifier 50 of known construction, wherein amplifier 50 includes a non-inverting input 52 connected to ground potential. An inverting input 54 is connected to one end of a first resistor R1, one end of a second feedback resistor R2, an anode of a first diode D1 and a cathode of a second diode D2. The opposite end of feedback resistor R2 is connected to an output 56 of amplifier 50 and provides a signal $V_{out}$. When amplifier circuit 20" is inserted into the signal processing circuit 10 of FIG. 1, the signal $V_{OUT}$ preferably corresponds to the processed audio signal provided to de-emphasis circuit 24. Alternatively, a capacitor C may be provided which has a first end connected to inverting input 54 and a second end connected to output 56. The combination of the capacitor C and the feedback resistor R2 forms a known de-emphasis circuit so that, if capacitor C is included as shown in FIG. 4, de-emphasis circuit 24 of FIG. 1 is not needed. It will be further recognized by those skilled in the art that $V_{OUT}$ may be alternatively provided to other audio signal processing circuits as part of a system wherein it is desirable to provide lower gain to low amplitude components and higher gain to higher amplitude components of a communication signal.

The cathode of D1 is connected to the anode of D1 and to a first end of a third resistor R3. The opposite end of resistor R3 is connected to signal path 22 (FIG. 1) and receives a signal $V_{IN}$. When amplifier circuit 20" is inserted into the signal processing circuit 10 of FIG. 1, the signal $V_{IN}$ corresponds to the pre-emphasized audio signal provided by pre-emphasis circuit 16. However, those skilled in the art will recognize that $V_{IN}$ may be any communication signal wherein it is desirable to provide lower gain to low amplitude components and higher gain to higher amplitude components of the communication signal.

The transfer function of the amplifier circuit 20" illustrated in FIG. 4 is defined as the instantaneous gain of the circuit which is given by the equation:

$$\text{instantaneous gain} = R2/\{1/[1/(R3 + \text{diode resistance}) + 1/R1]\} \qquad (3),$$

wherein the diode resistance is given by equation (2).

Figure 5:
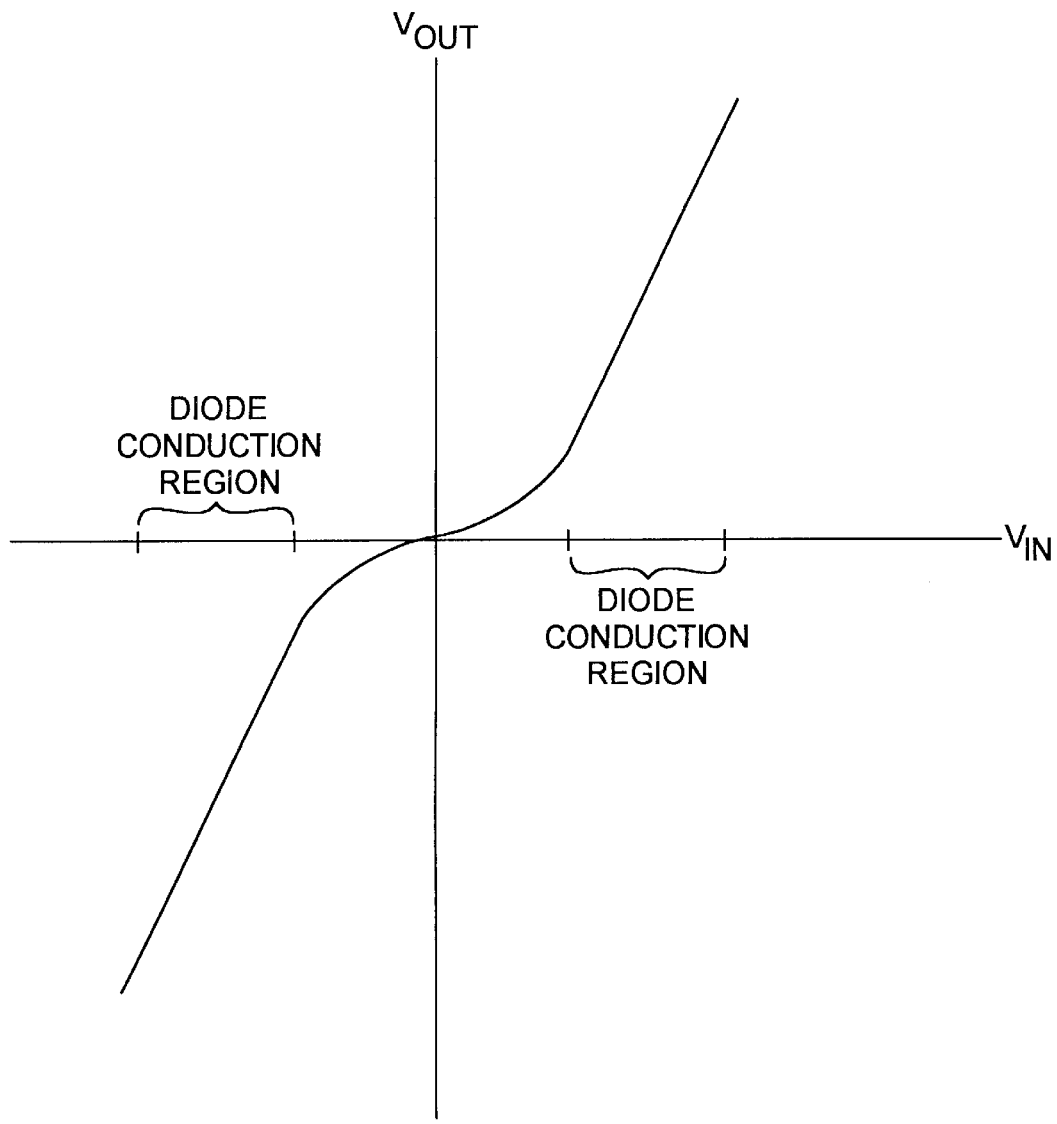
FIG. 5 is a plot illustrating the general shape of the transfer function of either of the gain circuits of FIG. 3 or 4.

Referring now to FIG. 5, a plot of $V_{OUT}$ vs $V_{IN}$ 60 is shown which represents the transfer function of either of the amplifier circuit embodiments shown in FIGS. 3 or 4, wherein the transfer function for each is defined in accordance with equations (1), (2) and (3) as described above. From FIG. 5, it can be seen that the transfer function for either amplifier circuit 20' or 20" is a non-linear and smooth transfer function providing lower gain for lower amplitude signals and higher gain to higher amplitude signals. In one preferred embodiment, the transfer function illustrated by plot 60 provides a slope in the diode conduction regions of between approximately one and three, and hence provides a gain in these regions of between approximately one and three. Those skilled in the art will, however, recognize that plot 60 may be configured to provide for other desired gain values.

Audible distortion of the audio signal 14 processed by the signal processing circuit 10 is minimized by the smooth low to high gain transition of the amplifier circuit transfer function 60 (FIG. 5), the bi-directional nature of the transfer function 60 which cancels even-order harmonics and by the use of the pre-emphasis and de-emphasis circuits 16 and 24 respectively. Pre-emphasis also tends to flatten vehicle noise spectra and thus improve low-frequency noise rejection of signal processing circuit 10.

The following table contains typical values for some of the electrical components illustrated in FIGS. 3 and 4, although it should be understood that the present invention contemplates configuring amplifier circuits 20' and 20" with alternate component values.

| FIG. | COMPONENT | VALUE |
|------|-----------|-------|
| 3    | R1        | 100 kohms |
| 3    | R2        | 220 kohms |
| 4    | R1        | 220 kohms |
| 4    | R2        | 220 kohms |
| 4    | R3        | 100 kohms |

The present invention is illustrated and described in detail in the drawings and foregoing description, the same is to be considered as illustrative and not restrictive in character, it being understood that only the preferred embodiments have been shown and described and that all changes and modifications that come within the spirit of the invention are desired to be protected.

The embodiments of the invention in which an exclusive property or privilege is claimed are defined as follows:

1. A signal processing circuit for reducing noise in an audio signal, comprising:

a pre-emphasis circuit having an input receiving an audio signal and an output providing a pre-emphasized representation of said audio signal, said audio signal including higher amplitude audio components and lower amplitude noise components when said higher amplitude audio components are not present;

an amplifier including a first input coupled to said pre-emphasis circuit output and an output, said amplifier defining a transfer function providing higher gain to said higher amplitude audio components and lower gain to said lower amplitude noise components of said audio signal; and a de-emphasis circuit having an input directly connected to said amplifier output and an output providing a de-emphasized representation of said audio signal processed by said amplifier in accordance with said transfer function.

2. The signal processing circuit of claim 1 wherein said transfer function is a non-linear transfer function.

3. The signal processing circuit of claim 1 wherein said first input of said amplifier is a non-inverting input;

and wherein said amplifier further includes an inverting input connected to one end of a first resistor and one end of a second resistor with an opposite end of said first resistor connected to said amplifier output and an opposite end of said second resistor connected to an anode of a first diode and a cathode of a second diode, said first diode having a cathode connected to an anode of said second diode and to ground potential.

4. The signal processing circuit of claim 1 wherein said first input of said amplifier is an inverting input connected to one end of a first resistor, one end of a second resistor, an anode of a first diode and a cathode of a second diode;

and wherein an opposite end of said first resistor is connected to said amplifier output, and an opposite end of said second resistor connected to said output of said pre-emphasis circuit and one end of a third resistor, an opposite end of said third resistor connected to a cathode of said first diode and an anode of said second diode;

and wherein said amplifier includes a non-inverting input connected to ground potential.

5. The signal processing circuit of claim 1 wherein said amplifier comprises an input circuit in series with said first input and a negative feedback circuit, and one of said input circuit and said negative feedback circuit comprises a pair of parallel connected diodes, the pair of diodes having a cathode of each connected to an anode of the other so as to provide bi-directional, non-linear current flow therethrough.

* * * * *